(12) United States Patent
Sitzman

(10) Patent No.: US 10,101,390 B2
(45) Date of Patent: Oct. 16, 2018

(54) BOUNDARY SCAN TEST SYSTEM

(71) Applicant: Prometheus Electronics LLC, Palm Bay, FL (US)

(72) Inventor: Justin Sitzman, Melbourne, FL (US)

(73) Assignee: Prometheus Electronics LLC, Palm Bay, FL (US)

( * ) Notice: Subject to any disclaimer, the term of this patent is extended or adjusted under 35 U.S.C. 154(b) by 112 days.

(21) Appl. No.: 15/394,972

(22) Filed: Dec. 30, 2016

(65) Prior Publication Data

US 2018/0188320 A1 Jul. 5, 2018

(51) Int. Cl.
G01R 31/317 (2006.01)
G01R 31/3177 (2006.01)

(52) U.S. Cl.
CPC ... *G01R 31/3177* (2013.01); *G01R 31/31725* (2013.01); *G01R 31/31727* (2013.01)

(58) Field of Classification Search
CPC ............... G01R 31/28; G01R 31/3185; G01R 31/8181; G01R 31/31725; G01R 31/31727
USPC ........................................ 714/726–729, 738
See application file for complete search history.

(56) References Cited

U.S. PATENT DOCUMENTS

| 6,286,119 | B1 | | 9/2001 | Wu et al. | |
| 6,381,720 | B1 | * | 4/2002 | Nakamura | G01R 31/31855 714/727 |
| 6,539,497 | B2 | * | 3/2003 | Swoboda | G06F 11/261 713/601 |
| 6,861,866 | B2 | * | 3/2005 | Han | G01R 31/31705 326/16 |
| 7,665,002 | B1 | * | 2/2010 | White | G01R 31/31705 714/727 |
| 2010/0174958 | A1 | * | 7/2010 | Maeda | G01R 31/318555 714/727 |

* cited by examiner

Primary Examiner — Albert K Wong
(74) Attorney, Agent, or Firm — Kelly G. Swartz; Widerman Malek, PL

(57) ABSTRACT

A testing system including a plurality of ports, at least one controller, and a programmable memory. The plurality of ports may be adapted to implement an IEEE 1149.x standard interface. The at least one controller may be in electronic communication with at least one of the plurality of ports. The programmable memory may be in electrical communication with the at least one controller and adapted to store at least one clock forming variable. The at least one controller may be adapted to form an IEEE 1149.x clock signal for at least one of the plurality of ports based on the at least one clock forming variable. The at least one controller controls the IEEE 1149.x clock signal for at least one of the plurality of ports independently of the IEEE 1149.x clock signal for any other of the plurality of ports.

13 Claims, 9 Drawing Sheets

BOUNDARY SCAN TEST SYSTEM

FIELD OF THE INVENTION

The present invention relates to systems and methods for performing electronic circuitry containing boundary scan (IEEE 1149.x compliant) operations.

BACKGROUND

Boundary scan is a term used to describe circuitry typically built into discrete integrated circuits in accordance with the IEEE 1149.x standards. In general, a set of pins (known as the Test Access Port, or TAP) control a finite state machine internal to a boundary scan compliant integrated circuit (IC). Through electrical connections to the TAP pins of the IC, an external boundary scan controller is able to control the finite state machine within the IC.

Boundary scan is used primarily for two purposes: to test assembled circuit cards in order to locate manufacturing defects, and to program certain classes of components (comprising NOR FLASH, NAND FLASH, EEPROM, MRAM, and other types of programmable devices). Although it provides many valuable test and programming related functions, boundary scan has the disadvantage of being a relatively low speed test platform. Modern circuit design increasingly consists of high speed signals and large programmable devices, both of which present challenges. Many manufacturing and design defects cannot be detected at low speeds, and large programmable devices can require undesirably long periods of time to program.

Boundary scan consists of both serial and parallel elements. The finite state machine provides a means of shifting data in to and out from a boundary scan circuit serially. Serial input data contains binary values which control the function of pins on the associated IC(s) while boundary scan is active. For example, an output capable pin may be caused to drive a logic 0, a logic 1, or to be tri-stated. In another example, a bidirectional pin may be set to input mode. When the Update event occurs, the binary values from the serial input data take effect simultaneously. The states of output capable pins update in parallel when the Update event occurs. Serial output data contains a number of binary values, a portion of which corresponds to the logic states sensed by input capable pins at the previous capture event. Input capable pins are sampled in parallel when the Capture event occurs.

The IEEE 1149.x standards which define the operation of so-called compliant devices dictate that the Update and Capture events occur at different points within the state machine operation. The minimum time between Update and Capture events is 2.5 cycles of TCK, assuming 50% duty cycle for the IEEE 1149.x clock signal. The minimum time between two Update events (or between two Capture events) is roughly equal to the cycle time of TCK multiplied by the number of boundary scan cells within the boundary register(s) of the devices in a particular boundary scan chain. The maximum frequency that a particular boundary scan compliant device can operate at is defined by the manufacturer of that device. When a boundary scan controller is communicating with more than one boundary scan device, the maximum TCK frequency is determined by the individual lowest TCK frequency of any controlled boundary scan devices. Attempts to operate a particular device with a TCK faster than this maximum frequency violates timing, and correct device operation cannot be guaranteed or expected. These constraints impact test in four ways:

1. The time between the state change on an output signal and the next sense of an input signal will be a minimum of 2.5 TCK cycles. Propagation delays and other events which occur in less time than 2.5 TCK cycles cannot be observed accurately (Update to Capture timing limitation);
2. The time between subsequent state changes of output signals will in general be very long (Update to Update timing limitation);
3. The time between subsequent sense events will in general be very long (Capture to Capture timing limitation); and
4. The time between one sense event and the next state change will in general be very long (Capture to Update timing limitation).

Numerous patents relating to methods to realize improved control over the timing of the Update and Capture events exist. U.S. Pat. No. 6,286,119 (the '119 patent) describes a method to enable testing of interconnect delay timing. The invention of the '119 patent requires the ability to implement a programmable delay following the Update event in order to allow control over the time between Update and Capture events. The invention of the '119 patent has the drawback of requiring additional signals beyond those defined by the standard IEEE 1149.x TAP port. U.S. Pat. No. 7,493,537 (the '537 patent) describes a method to provide extensions to the JTAG instruction set in order to enable testing of high speed IC to IC circuits. The invention of the '537 patent has the drawback of requiring modifications to the IEEE 1149.x standards in order to function. The '537 patent also requires an additional physical signal engaging with the TAP state machine. U.S. Patent Application No. 2013/0314102 (the '102 application) describes a method to add programmable timing circuitry within a boundary scan compliant device in order to facilitate timing related improvements. The invention of the '102 application has the drawback of requiring additional circuitry within boundary scan devices. It also has the drawback of requiring additional physical signals.

The IEEE 1149.x standards provide for the ability to connect multiple boundary scan devices together in a serial fashion (called boundary scan chains). In the most common topology, the first device in a chain has its TDI (Test Data In) pin configured in such a way as to enable it to be driven electrically by a boundary scan controller; the TDO (Test Data Out) pin from the first boundary scan device in a chain is configured in such a way that it is able to drive the TDI pin of the second device in the chain; the TDO pin from the boundary scan device at index N is configured in such a way that it is able to drive the TDI pin of the boundary scan device at index N+1, repeating until the final boundary scan device in the chain is reached; the TDO pin of the final boundary scan device in the chain is configured in such a way that it is able to electrically drive an input capable receiver at the boundary scan controller; the TMS pins of all boundary scan devices in the chain are configured in such a way that the boundary scan controller is able to drive all TMS pins simultaneously to the same logic level; generally, the boundary scan controller can drive all TMS pins within a given boundary scan chain either LO or HI simultaneously; the TCK pins of all boundary scan devices in the chain are configured in such a way that the boundary scan controller is able to drive all TCK pins simultaneously to the same logic level; generally, the boundary scan controller can drive all TCK pins within a given boundary scan chain either LO or HI simultaneously; the TRST pins of all boundary scan devices in the chain are configured in such a way that the boundary scan controller is able to drive all TRST pins simultaneously to the same logic level; generally, the boundary scan controller can drive all TRST pins within a given boundary scan chain either LO or HI simultaneously; the TRST pin is an optional pin per the 1149.x standards, which, in some topologies, may be continuously asserted HI, effectively removing the impact of the TRST pin from the state machines of impacted device(s).

Often, a boundary scan chain contains one or more boundary scan devices. However, a single-device chain is a valid boundary scan chain construct. A test access port, or TAP, is an IEEE defined term referring to the signals interfacing to the boundary scan state machine of a boundary scan device or boundary scan chain. The IEEE 1149.1 standard defines four required signals (TDI, TDO, TMS, and TCK) and one optional signal (TRST), which make up the TAP. The test data in, or TDI, signal is required in accordance with the IEEE 1149.1 standard. TDI is output from a boundary scan controller and input to a boundary scan device or chain. Instruction opcodes and input vectors are shifted in to a boundary scan device or chain via TDI. The test data out, or TDO, signal is required per the IEEE 1149.1 standard. TDO is input to a boundary scan controller and output from a boundary scan device or chain. Results from register read operations, as well as result vectors, are shifted out from a boundary scan device or chain via TDO. The test mode select, or TMS, signal is required per the IEEE 1149.1 standard. TMS is output from a boundary scan controller and input to a boundary scan device or chain. The test clock, or TCK, signal is required per the IEEE 1149.1 standard. TCK is output from a boundary scan controller and input to a boundary scan device or chain. TMS and TCK are used to control the state machines internal to a boundary scan device(s). The test reset, or TRST, signal is optional per the IEEE 1149.1 standard. TRST provides an asynchronous reset to the boundary scan state machine, machines of a boundary scan device, or boundary scan chain.

The IEEE 1149.7 standard (sometimes referred to as Compact JTAG) is similar to the IEEE 1149.1 standard. The IEEE 1149.7 standard defines two required signals (TMSC and TCKC) and three optional signals (TDI, TDO, and TRST). The test mode select compact, or TMSC, signal is required per the IEEE 1149.7 standard. TMSC operates in a flexible multiplexed fashion, allowing the functions of TDI, TDO, and TMS to be supported via a single bidirectional signal. When TDI functionality is active, the TMSC signal is an output from a controller and an input to a boundary scan device or chain. When TDO functionality is active, the TMSC signal is an input to a controller and an output from a boundary scan device or chain. When TMS functionality is active, the TMSC signal is an output from a controller and an input to a boundary scan device or chain. TCKC and the TMS portion of TMSC are used to control the state machines internal to a boundary scan device(s). The test dock compact, or TCKC, signal is required per the IEEE 1149.7 standard. TCKC is output from a boundary scan controller and input to a boundary scan device or chain. TCKC and the TMS portion of TMSC are used to control the state machines internal to a boundary scan device(s). The test data in, or TDI, signal is optional per the IEEE 1149.7 standard. TDI is output from a boundary scan controller and input to a boundary scan device or chain. Instruction opcodes and input vectors are shifted in to a boundary scan device or chain via TDI. The functions of TDI can be incorporated into the TMSC signal, making TDI optional. The test data out, or TDO, signal is optional per the IEEE 1149.7 standard. TDO is input to a boundary scan controller. And output from a boundary scan device or chain. Results from register read operations, as well as result vectors, are shifted out from a boundary scan device or chain via TDO. The functions of TDO can be incorporated into the TMSC signal, making TDO optional. The test reset, or TRST, signal is optional per the IEEE 1149.7 standard. TRST provides an asynchronous reset to the boundary scan state machine(s) of a boundary scan device or boundary scan chain.

There are numerous possible TAP port topologies for the various IEEE 1149.x standards. However, all TAP port topologies provide access to the state machine(s) of boundary scan device(s) or boundary scan chains. Provided that the TAP port topology matches the topology of a target boundary scan device or boundary scan chain, the end result is the same: a controller is able to control the state machine(s), shift opcodes or test vectors in to the device(s) or chain(s), and shift result data back from the device(s) or chain(s).

Multiple boundary scan chains can exist within a particular design. This is common practice, for a variety of reasons. One common practice is to group devices from a particular manufacturer together into a single boundary scan chain. This is done frequently to mitigate issues arising from any non-standard implementations of the 1149.x standard on the part of the relevant manufacturer. The JTAG port is frequently used for device programming and device emulation, as well as boundary scan based test. It is not uncommon for device programming or device emulation guidelines from the device manufacturer to require that a device be located in a restricted boundary scan chain. The restrictions on the chain may include, but are not limited to, limitations to the number of boundary scan devices in the chain and limitations to the vendor(s) of other boundary scan devices in the chain. The effective test vector pattern rate is roughly inversely related to the number of boundary scan cells in the chain. More devices in a chain leads to more cells, which leads to slower effective test vector pattern rates. By dividing a single large boundary scan chain into a number of shorter boundary scan chains, the effective test vector pattern rate can be increased. A single boundary scan chain can be formed by appropriately connecting two or more individual boundary scan chains. Thus, test hardware, software, or a combination of hardware and software, can be used to define the actual boundary scan topology.

The boundary scan state machine, as depicted in FIG. 5, includes a number of states. In accordance with the IEEE 1149.x standard, the state machine is navigated by asserting a binary value to the TMS signal(s), followed by applying a positive pulse to the IEEE 1149.x clock signal(s). Applying this to the boundary scan state machine in a manner currently utilized by existing boundary scan based test platforms yields the timing diagram shown in FIG. 6. Minor variations to the basic method of controlling the state machine exist within the IEEE 1149.x standard (including those defined by the 1149.7 standard), but these should not be construed as alternate methods of controlling the state machine. The states transited by the timing diagram in FIG. 6 should be transited in any functional instance of a boundary scan state machine controller.

The IEEE 1149.x standards are living documents, periodically updated. The 1149.7 standard defines a modified TAP port, consisting of a minimum of two pins: TCKC and TMSC. As described in the IEEE 1149 glossary, TCKC is roughly analogous to TCK as both are clocks. Either of these signals are referred to as the IEEE 1149.x clock signal throughout this document. In the IEEE 1149.7 standard, TMSC performs the functionality of TDI, TDO, and TMS signals through multiplexing. The IEEE 1149.7 standard makes use of the same state machine as its 1149.x predecessors. This continuity throughout the evolution of the 1149.x standards makes it possible for the testing system 100 described herein to inherently apply to 1149.7 compliant devices as well as all other IEEE 1149.x compliant devices.

FIG. 2 depicts a prior art design containing two independent boundary scan chains 103 and 104. The first chain includes test connector 101 physically connected to the TAP port of the first boundary scan chain, which includes first electrical component U1. The second chain includes test connector 102 physically connected to the TAP port of the second boundary scan chain, which includes second electrical component U2.

FIG. 3 depicts a single boundary scan chain 103 including two electrical components U1 and U2. The TMS, TCK, and TRST (an optional TAP signal) are connected in parallel to both electrical components U1 and U2 through a single test connector 101. The TDO of the upstream electrical component device U1 is connected to the TDI of a downstream electrical component U2. The boundary scan chain 103 has a single root TDI, at the first electrical component U1 in the boundary scan chain 103. The boundary scan chain 103 has a single root TDO, at the final electrical component U2 in the chain. The test connector 101 physically connects to the TAP port of the boundary scan chain 103.

FIG. 4 depicts a design containing two independent boundary scan chains 103 and 104. Test connector 101 physically connects to the TAP port of the first boundary scan chain 103. Test connector 102 physically connects to the TAP port of the second boundary scan chain 104. External connections to the test connectors 101 and 102 are shown connecting the TAP interfaces of the two boundary scan chains 103 and 104 into the same effective topology as the boundary scan chain 103 in FIG. 3.

Those skilled in the art of electrical design will recognize that it is possible to implement a number of methods in order to realize the ability to dynamically change the topology of a boundary scan chain or chains. For example, in FIG. 4, multiplexors or digital logic connected to the TAP interfaces of the electrical components U1 and U2 could be used dynamically reconfigure the two TAP ports, enabling the electrical components U1 and U2 to appear in independent chains, as well as a chain consisting of electrical components U1 and U2 in either forward or reverse order. These techniques have been used within the electronics industry.

FIG. 6 depicts a standard boundary scan timing diagram for a scenario containing two independent boundary scan chains 103 and 104. This diagram in FIG. 6 omits the TRST signal for simplicity. As the timing for the first boundary scan chain 103 and the second boundary scan chain 104 are identically, the timing diagram shown by FIG. 6 can be expanded indefinitely by adding additional blocks to accommodate additional boundary scan chains with no upper limit to the number of possible boundary scan chains. Most known boundary scan controllers cause their controlled boundary scan devices to traverse their respective state machines as depicted in FIG. 6. As the timing diagram shows, this boundary scan controller causes all boundary scan chains to traverse their respective state machines simultaneously.

As depicted in FIG. 6, all boundary scan chains change states effectively simultaneously. There may be slight deviations in the exact timing of the transitions of TMS and the IEEE 1149.x clock signal as a result of deviations in propagation delays internal to the electrical hardware responsible for asserting the associated signals, but the underlying intent is to keep all chains traversing their state machines synchronously.

At time t3, one Capture event occurs for all boundary scan chains. The input capable pins connected to all boundary scan chains capture their values effectively simultaneously. At time t1, one Update event occurs for all boundary scan chains. The values asserted by output capable pins connected to all boundary scan chains update effectively simultaneously. At time t2, a second Capture event occurs for all boundary scan chains. T2 occurs 2.5 IEEE 1149.7 clock signal cycles after t1. At time t4, a second Update event occurs for all boundary scan chains.

As depicted in FIG. 6, the period of time between t1 and t2 is defined by the IEEE 1149.x standards as requiring 2.5 cycles of the IEEE 1149.x clock signal (assuming 50% duty cycle for the IEEE 1149.x clock signal). Specifically, for a boundary scan chain in UPDATE-DR state, the falling edge of IEEE 1149.x clock signal causes the Update event within the relevant devices to occur. With TMS at a logic HI, the next rising edge of the IEEE 1149.x clock signal causes the boundary scan chain to enter SELECT-DR-SCAN state. A falling edge of the IEEE 1149.x clock signal is required in order for the state machine to proceed to the next state. With TMS at a logic LO, the next rising edge of the IEEE 1149.x clock causes the boundary scan chain to enter CAPTURE-DR state. A falling edge of the IEEE 1149.x clock is required in order for the state machine to proceed to the next state. With TMS at a logic LO, the next rising edge of the IEEE 1149.x clock signal causes the boundary scan chain to enter SHIFT-DR state. This causes the Capture event within the relevant devices to occur. The rising edge, falling edge, rising edge, falling edge, and rising edges described in this paragraph define the 2.5 IEEE 1149.x clock signal cycle minimum time between Update and Capture events referenced elsewhere in this document. As depicted in FIG. 6, binary values driven by output pins, referred to as Outputs_x in FIG. 6, are updated on the falling edge of the IEEE 1149.x clock signal while the device is in the UPDATE-DR state. As depicted in FIG. 6, binary values present at input pins, referred to as Inputs_x in FIG. 6, are captured on the rising edge of the IEEE 1149.x clock signal when the device enters the SHIFT-DR state.

The 2.5 TCK cycle minimum time between Update and Capture events represents a significant limitation for test purposes. One instance where this limitation limits test capability is delay timing. For a variety of reasons, knowledge of the amount of time it takes for a change in the value driven by one pin on a net to propagate to another pin on the same (or different) net is valuable information. Because logic level changes propagate at the speed of light in an environment void of resistive, inductive, and capacitive effects, the 2.5 TCK cycle minimum time between Update and Capture events precludes the ability to test delay timing. The propagation time is significantly smaller than the clock.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the above in mind, embodiments of the present invention are related to a testing system including a plurality of ports, at least one controller, and a programmable memory. The plurality of ports may be adapted to implement an IEEE 1149.x standard interface. The at least one controller may be in electronic communication with at least one of the plurality of ports. The programmable memory may be in electrical communication with the at least one controller and may be adapted to store at least one clock forming variable. The at least one controller may be adapted to form an IEEE 1149.x clock signal for at least one of the plurality of ports based on the at least one clock forming variable. The at least one controller may control the IEEE 1149.x clock signal for at least one of the plurality of ports independently of the IEEE 1149.x clock signal for any other of the plurality of ports.

The at least one controller may be adapted to receive a test vector from, receive at least one clock forming variable from, and transmit a test result vector to an external computer.

A duty cycle of the IEEE 1149.x clock signal may be continuously adjustable between 0% and 100%.

At least one clock forming variable may control a duty cycle, frequency, or phase shift of the IEEE 1149.x clock signal of at least one of the plurality of ports.

Each of the IEEE 1149.x clock signals may be adapted to have a fixed duty cycle. At least one clock forming variable may controls a phase offset between an IEEE 1149.x clock signal of a first port and an IEEE 1149.x clock signal of a second port.

Each IEEE 1149.x clock signal may be adapted to have a variable duty cycle and at least one clock forming variable may control a phase offset between an IEEE 1149.x clock signal of a first port and an IEEE 1149.x clock signal of a second port.

The testing system may include at least one timing circuit in electronic communication with the at least one controller. The programmable memory may be in electrical communication with the at least one timing circuit.

DETAILED DESCRIPTION OF THE INVENTION

Figure 1:
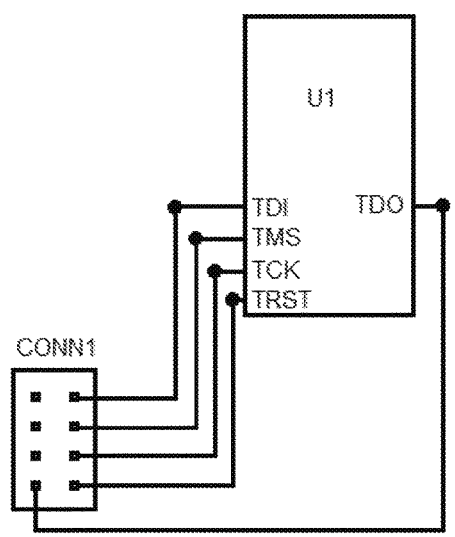
FIG. 1 is a prior art boundary scan chain consisting of a single device.
Figure 2:
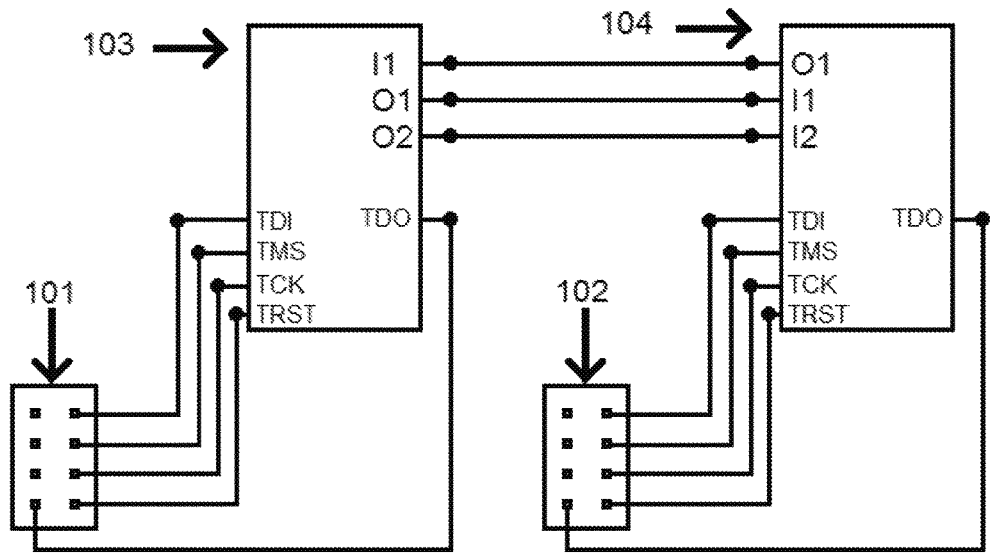
FIG. 2 is a prior art design containing two independent boundary scan chains.
Figure 3:
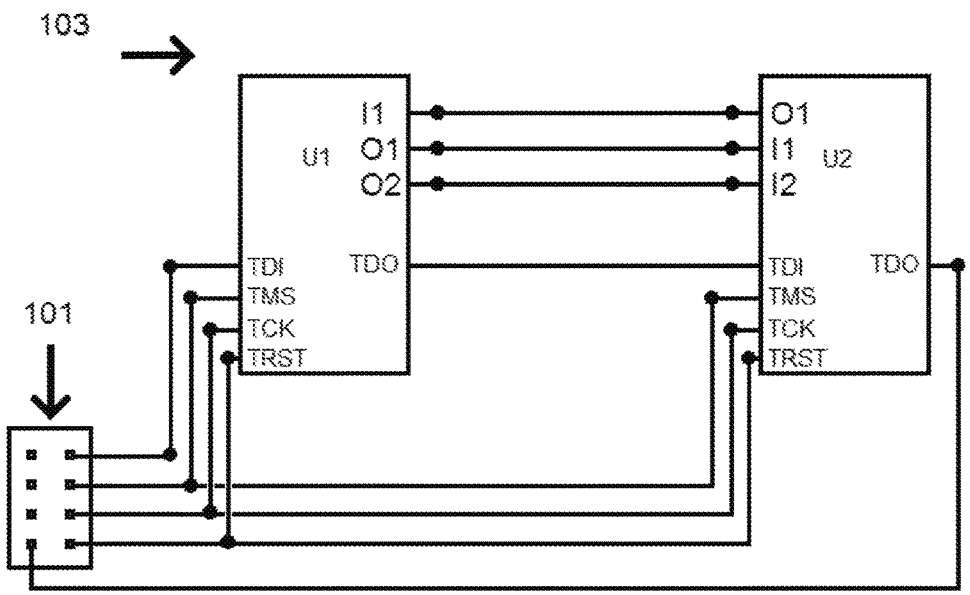
FIG. 3 is a prior art boundary scan chain consisting of two devices.
Figure 4:
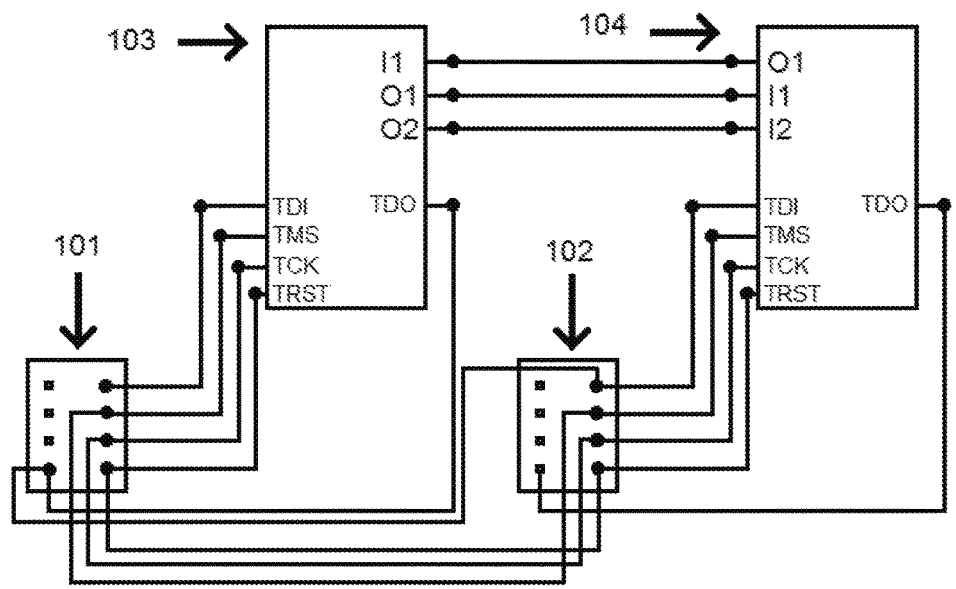
FIG. 4 is a prior art design containing two independent boundary scan chains.
Figure 5:
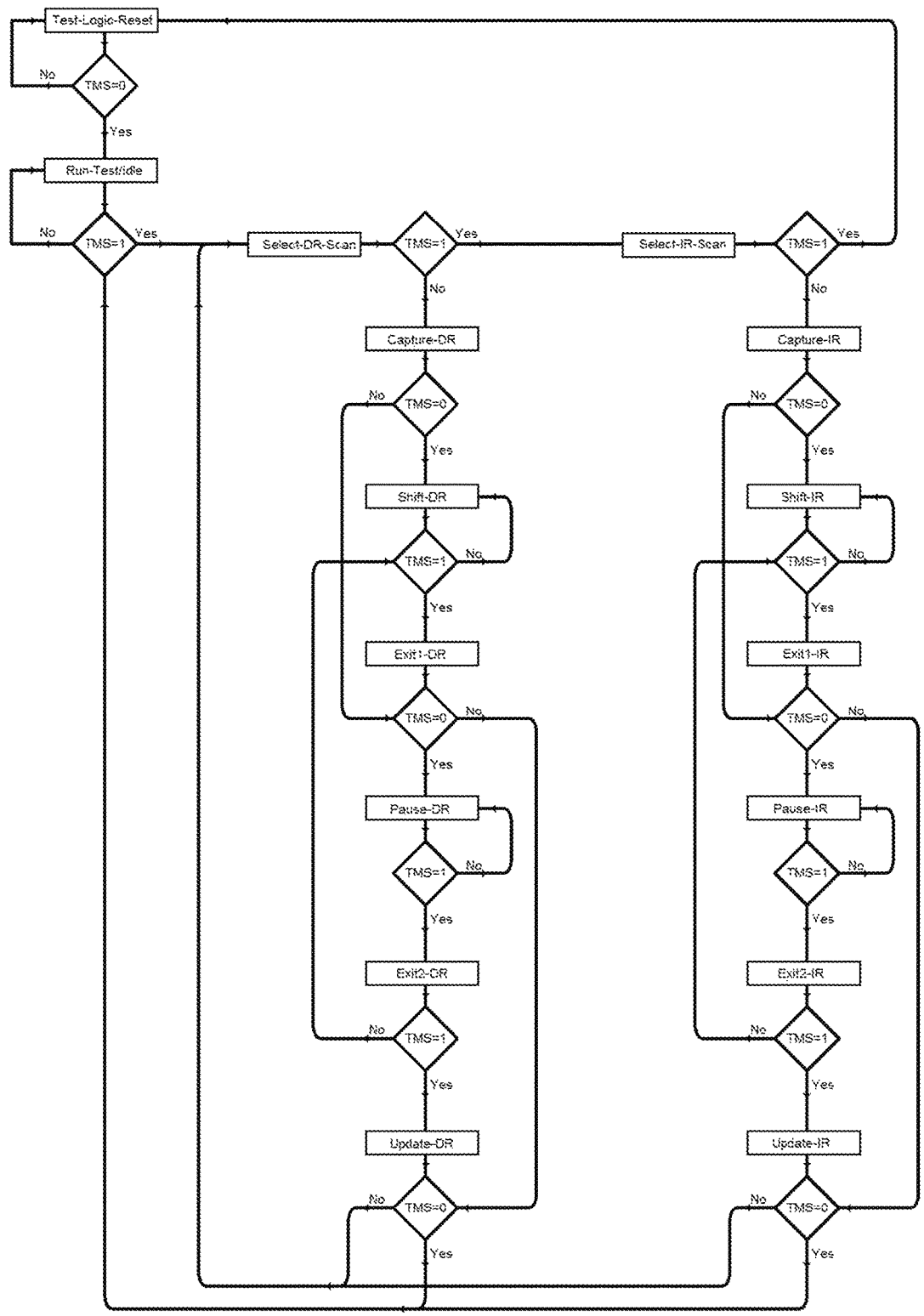
FIG. 5 depicts a prior art boundary scan state machine.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

In this detailed description of the present invention, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present invention.

Furthermore, in this detailed description, a person skilled in the art should note that quantitative qualifying terms such as "generally," "substantially," "mostly," and other terms are used, in general, to mean that the referred to object, characteristic, or quality constitutes a majority of the subject of the reference. The meaning of any of these terms is dependent upon the context within which it is used, and the meaning may be expressly modified.

An embodiment of the testing system 100, as shown and described by the various figures and accompanying text, provides a system and method for performing boundary scan tests on electronic devices. By controlling the finite state machine, the external boundary scan controller 106 may be able to cause a number of events to occur. The invention operates on all known topologies, with the only restriction being that at least two boundary scan chains exist in the target design. The testing system 100 may sample the values present at input capable pins of an IC implementing an IEEE 1149.x standard. Such sampling may be referred to within this document as 'Capture' or 'Capturing'. The testing system 100 may assert desired logic values on, disable, or enable output capable pins, including bi-directional pins, of the testing system 100. This is referred to within this document as 'Update' or 'Updating'.

The testing system 100 may be used with electronic devices designed to implement conventional 1149.x standards. The testing system 100 may enable Update or Capture events to be generated in extremely close time proximity to one another. This may be done by operating two or more boundary scan chains in a time-shifted fashion. The timing constraints relating to Update and Capture events within a single boundary scan chain cannot be overcome without modification to the 1149.x standards. However, no constraints exist in regards to Update or Capture events on different boundary scan chains. Because a particular circuit design may contain any number of boundary scan chains, limitations regarding timing and sequencing of the Update or Capture events may be viewed as constrained by the particular circuit design as opposed to being constrained by the 1149.x standard.

Figure 6:
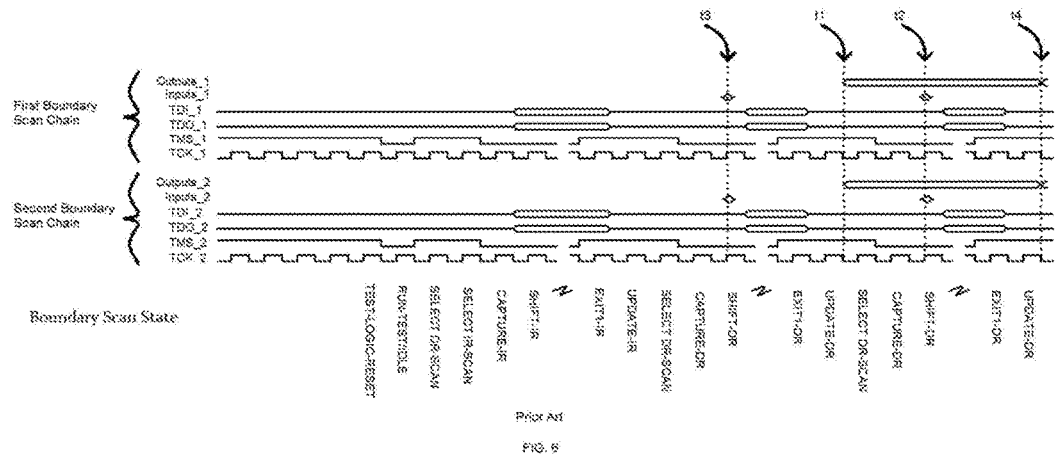
FIG. 6 depicts a prior art boundary scan timing for a scenario containing two independent boundary scan chains.

The testing system 100 implements a modification to the standard timing diagram detailed in FIG. 6. The testing system 100 takes advantage of the fact that, in cases where more than one boundary scan chain exists, all boundary scan chains do not necessarily need to traverse through their state machines simultaneously.

Figure 10:
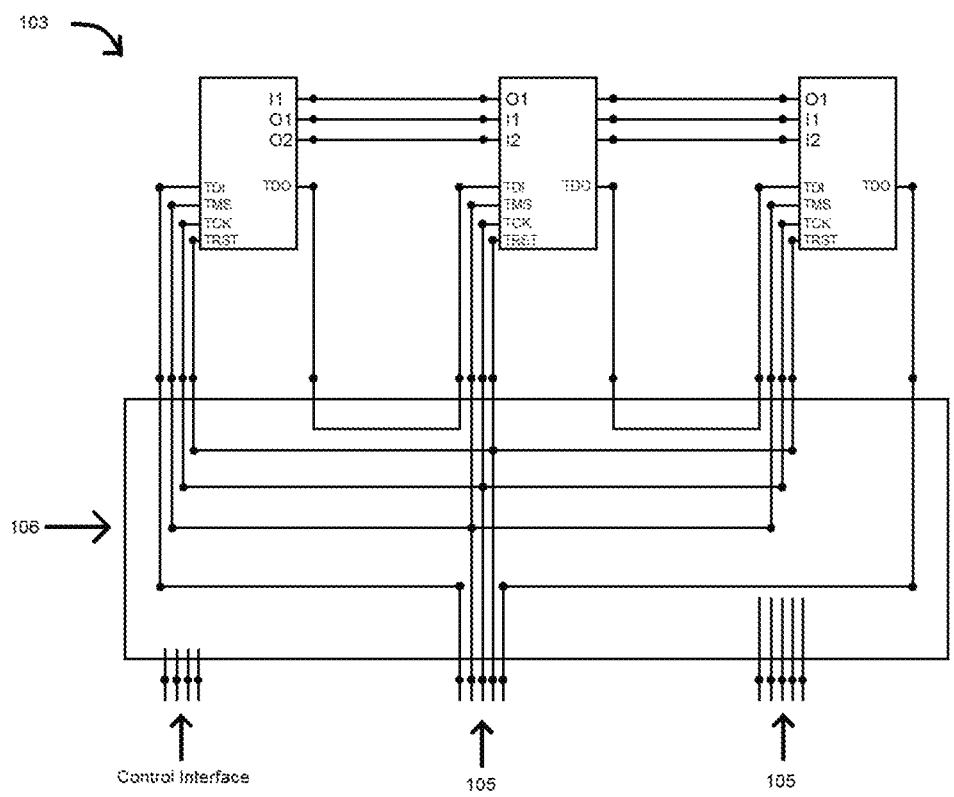
FIG. 10 depicts a boundary scan chain according to an embodiment of the present invention.
Figure 11:
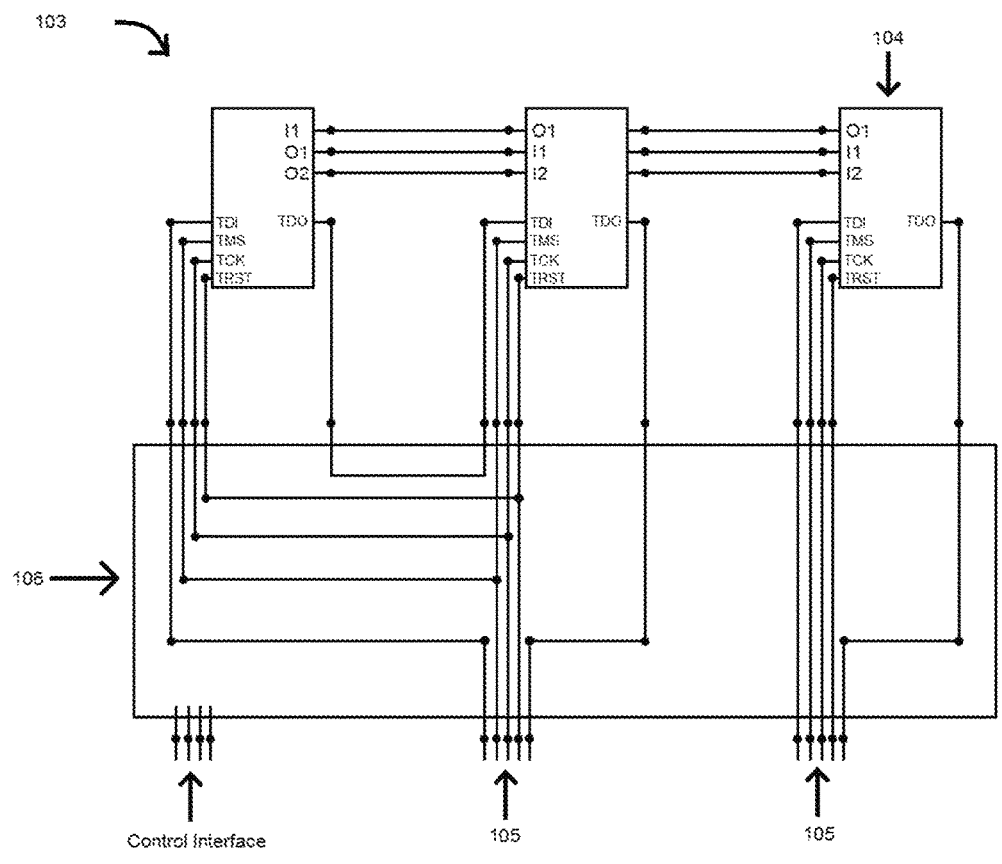
FIG. 11 depicts a plurality of boundary scan chains in combination with a boundary scan chain controller according to an embodiment of the present invention.

In general, a boundary scan chain consists of M devices. A Dynamic JTAG Chain Controller 106 device connects the M devices in a single logical chain, referred to as a boundary scan chain, when the binary values applied to the control signals equal a first value. As depicted in FIG. 10, a single logical chain, the first boundary scan chain 103, is accessible at a first port 105. When the control signals equal a second value, as depicted in FIG. 11 the controller 106 restructures the boundary scan chain such that a subset of the M devices inhabit the first boundary scan chain 103, while the remaining devices are relocated to a second boundary scan chain 104, which is physically accessible at a second port 105. The various binary combinations applied to the control signals result in the boundary scan chain being restructured in as many unique combinations as necessary to enable use of the testing system 100 for test purposes as desired.

By way of example, and not as a limitation, all M devices could be connected in a single boundary scan chain. The first device in the chain, U1, may be removed from the first boundary scan chain and placed by itself in a second boundary scan chain. The second device in the chain, U2, may be removed from the first boundary scan chain and placed by itself in a second boundary scan chain. The third device in the chain, U3, may be removed from the first boundary scan chain and placed by itself in the second boundary scan chain. This may be possible for all M devices. Such a configuration may allow the testing system 100 to exercise all discrete combinations of boundary scan devices for test purposes.

Figure 7:
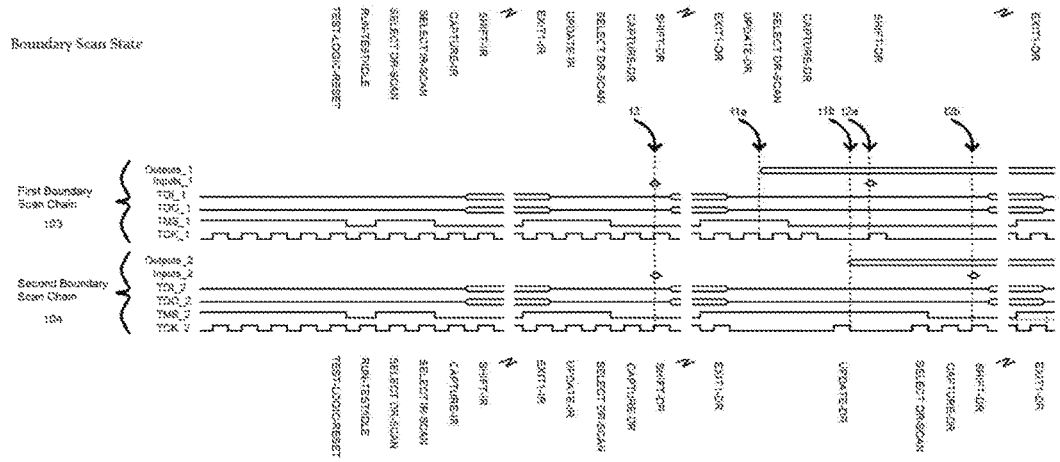
FIG. 7 depicts a timing diagram according to an embodiment of the present invention.

FIG. 7 depicts a timing diagram of the testing system 100. The testing system 100 may have a plurality of ports 105 which are physically connected to devices implementing the IEEE 1149.x standard. In the timing diagram of FIG. 7, the port interface timing between the first boundary scan chain 103 and the second boundary scan chain 104 has been modified. The TMS signals of the first boundary scan chain 103 and the second boundary scan chain 104 are not always synchronous, and are able to transition independently of each other. Likewise, the IEEE 1149.x clock signals of the first boundary scan chain 103 and the second boundary scan chain 104 are not always synchronous, and are able to transition independently of each other. This makes it possible to separate Update event(s) at the first boundary scan chain 103 from Update event(s) at the second boundary scan chain 104. This also makes it possible to separate Capture event(s) at the first boundary scan chain 103 from Capture event(s) at the second boundary scan chain 104. Furthermore, it makes it possible to realign the Update and Capture events at the first boundary scan chain 103 in relation to the Update and Capture events at the second boundary scan chain 104. This will be referred to as Decoupling and Realigning within this document. In the case of FIG. 7, the Update event for devices included in the second boundary scan chain 104 has been realigned to occur a small period of time before the Capture event for devices included in the first boundary scan chain 103. Note that the present invention does not require this period of time to be a fixed or static number. This period may be adjustable by design.

Furthermore, the number of boundary scan chains 103, 104 is not limited. In theory, an unlimited number of boundary scan chains may have their Update events and Capture events decoupled and realigned. Only a minimum of two boundary scan chains 103, 104 are required.

Figure 12:
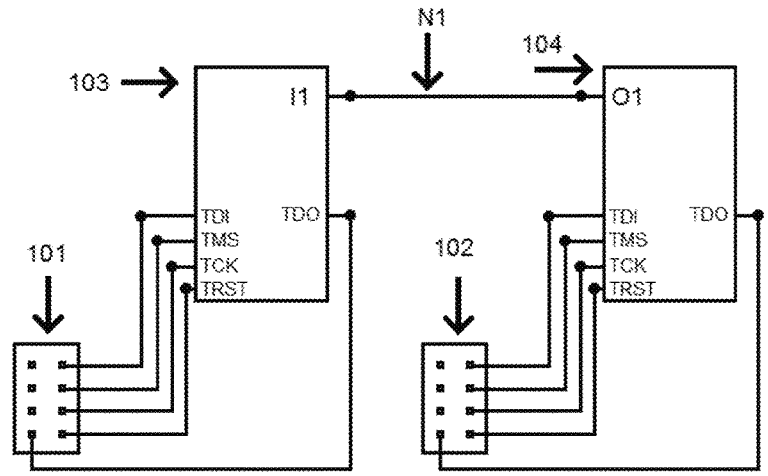
FIG. 12 depicts a plurality of boundary scan chains according to an embodiment of the present invention.

Decoupling and Realigning the Update and Capture events presents a number of advantages. By way of example, and as illustrated in FIG. 12, an output capable pin, O1, may be attached to a boundary scan device in a second boundary scan chain and electrically connected to an input capable pin, I1, attached to a boundary scan device in a first boundary scan chain on a net N1. By implementing the system 100 to accurately control the time between the Update at the first boundary scan chain and the second boundary scan chain, the system 100 can be used to accurately monitor the propagation delay between O1 and I1. Undesirable manufacturing artifacts can be located, including, but not limited to, high resistance solder connections, high resistance via connections, high resistance signal traces, incorrect capacitive coupling between N1 and other nets within the design, effects due to incorrect inductive elements within the various electrically conductive portions of the net, incorrect drive strength on the part of the electrical driver associated with O1, incorrect logic threshold on the part of the electrical receiver associated with I1.

Figure 13:
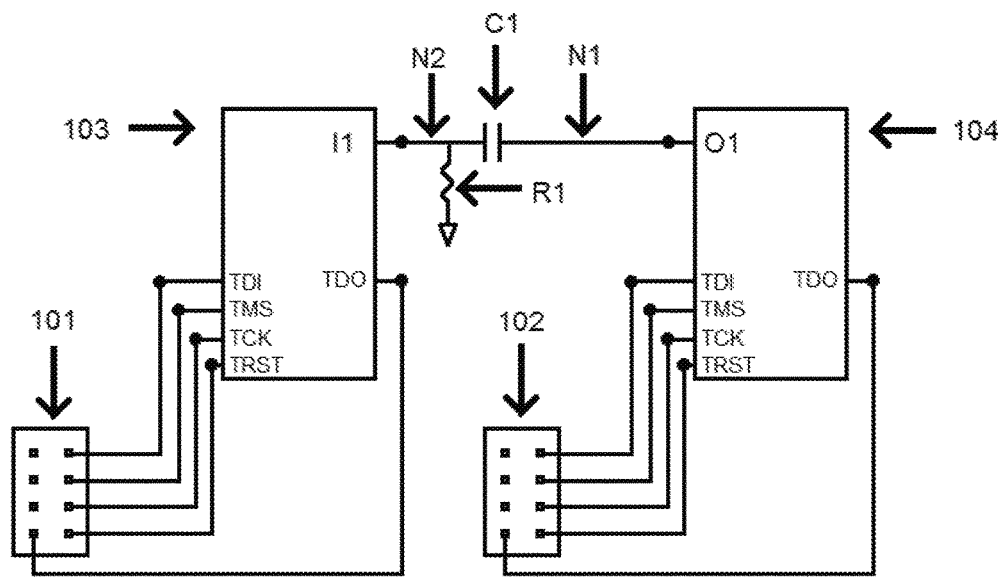
FIG. 13 depicts a plurality of boundary scan chains according to an embodiment of the present invention.
Figure 14:
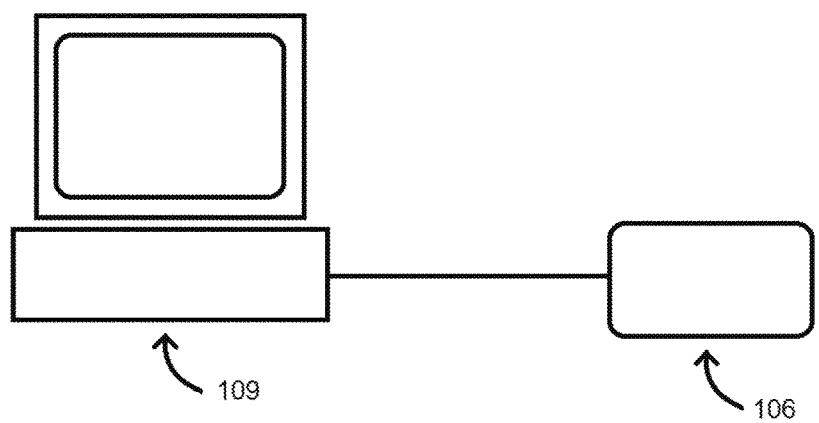
FIG. 14 depicts a controller in combination with an external computer according to an embodiment of the present invention.

By way of example, and as illustrated in FIG. 13, an output capable pin, O1, may be attached to a boundary scan device in a second boundary scan chain on a net N1. An input capable pin, I1, may be attached to a boundary scan device in a first boundary scan chain on a net N2. N1 and N2 may be electrically connected by a capacitor C1 such that pin P2 of C1 is electrically attached to N1 and pin P1 of C1 is electrically attached to N2. By way of example, and not as a limitation, N2 may be terminated to GND by a resistor R1. This topology, known by the term 'AC-coupled', is a common high speed topology. By implementing a method to accurately control the time between the Update at the second boundary scan chain and the Capture at, the first boundary scan chain, the system 100 may be used to accurately monitor the propagation delay between P1 and P2 through C1. Undesirable manufacturing artifacts can be located, including, by way of example, missing component C1, open pins at P1, P2, O1, or I1, incorrect value of component C1, incorrect part installed at the location intended to be populated by C1, high resistance solder connections, high resistance via connections, high resistance signal traces, incorrect capacitive coupling between N2 and other net(s) within the design, effects due to incorrect inductive elements within the various electrically conductive portions of the net, incorrect drive strength on the part of the electrical driver associated with O1, incorrect logic threshold on the part of the electrical receiver associated with I1, missing component R1, incorrect value of component R1, incorrect part installed at the location intended to be populated by R1, or the like.

By way of example, pins of a FLASH memory may be attached to suitable pins of onboard boundary scan devices, the FLASH memory may be programmed through the appropriate use of the attached boundary scan devices. In traditional systems, one drawback to programming FLASH devices via boundary scan is the relatively slow programming time. A major component of the programming time is the requirement that the FLASH Write Enable (WE) pin transition (typically a HI to LO transition) after the binary values asserted at the FLASH address and data pins have been established. This is referred to as set-up time. Existing boundary scan based FLASH programming methodologies require one boundary scan vector to accommodate the set-up time requirement for the address+data+control signals, and a second boundary scan vector to hold the values applied at the address+data+control signals while the appropriate transition is applied at the WE pin. Assuming that suitable boundary scan resources from one boundary scan chain are available at the address, data, and non-WE control signals, and that suitable boundary scan resources from an additional boundary scan chain are available at the WE signal, the Update events for the two boundary scan chains can be decoupled in accordance with the methods described by the present invention in order to accommodate asserting the FLASH address, data, and non-WE signals in advance of the write enable transition, within a single boundary scan vector. This represents an advantage in the ability to program FLASH via boundary scan in a fashion significantly more rapidly than currently available methods.

The testing system 100 and method requires no modifications to the IEEE 1149.x standards, the boundary scan state machine, or the device-level physical interface. No additional signals are required at any boundary scan device and no modifications to the existing pin functions of the test access port interface are required. The testing system 100 does invite those involved in the electrical design of circuit cards to fabricate the topology of boundary scan chains within their design(s) in order to make it possible to maximize the test and programming benefits made possible by the system 100.

Those skilled in the arts of boundary scan based testing will recognize that variants to the timing diagram depicted in FIG. 7 exist. For example, rather than operate the various boundary scan chains asynchronously between the EXIT1-DR and SHIFT-DR states, and synchronously otherwise, the same end result could be achieved by simply adding in a time delay, either electrical or physical, to the signals relating to one or more of the boundary scan chains. This would likewise decouple and realign the relative time positions of the Capture and Update events. Such variants do not depart from the spirit or the scope of the invention.

Figure 8:
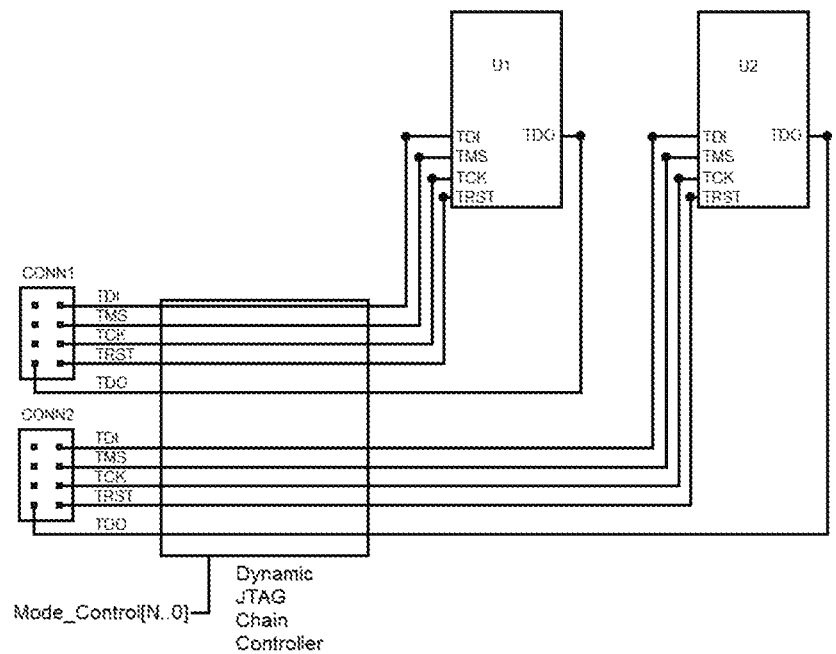
FIG. 8 depicts a design containing two independent boundary scan chains according to an embodiment of the present invention.
Figure 9:
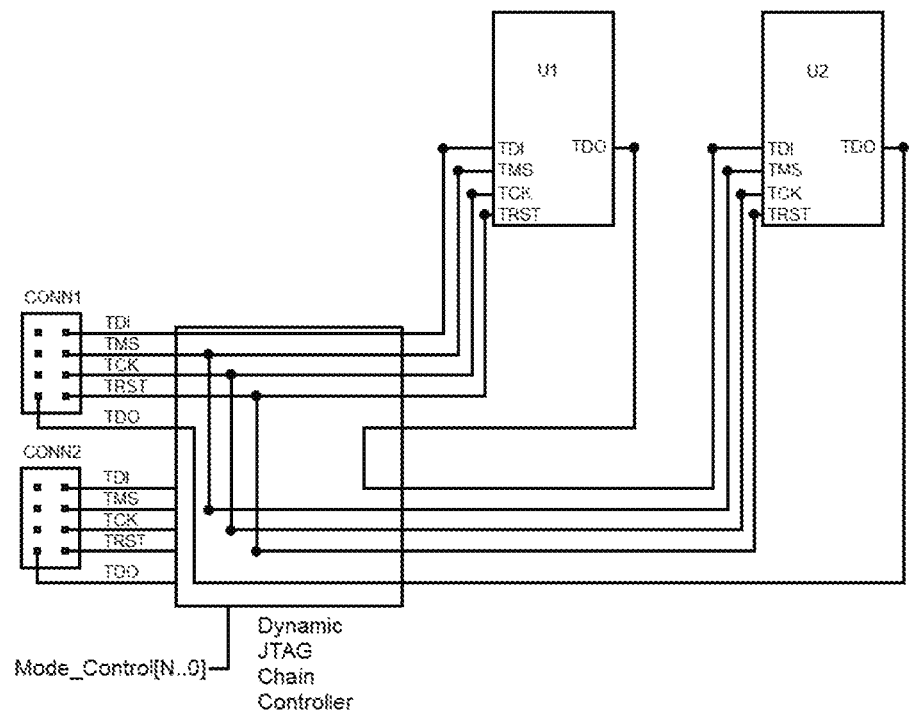
FIG. 9 depicts a boundary scan chain consisting of two devices according to an embodiment of the present invention.

The present invention also invites those involved in the electrical design of circuit cards to include circuitry, including, but not limited to, FPGA, ASIC, or microcontroller, capable of dynamically rearranging the boundary scan topology in a fashion which facilitates maximizing the test and programming benefits made possible by the system 100. By way of example, and not as a limitation, FIGS. 8 and 9 illustrate how a dynamic JTAG chain controller can rearrange the boundary scan chain topology based on a control signal or set of control signals.

Those skilled in the arts will recognize that the control interface to this hardware may take many forms, by way of example, and not as a limitation, binary decoded inputs, SPI, I2C, or the like, without departing from the functional intent of the hardware.

The testing system 100 may include a plurality of ports 105. Each of the plurality of ports 105 may be adapted to implement, an IEEE 1149.x standard interface. By way of example, and not as a limitation, each of the plurality of ports may include a physical connector in electrical connection with a controller 106 adapted to input or receive each signal required to implement the IEEE 1149.x standard on a compliant electrical device. Each of the plurality of ports 105 may also be adapted to removably secure to at least one external electronic device adapted to implement the IEEE 1149.x standard. The external electronic device may be the device under test. The controller 106 may be adapted to implement the IEEE 1149.x protocol. A programmable memory 107 may be in electrical communication with the controller 106. The programmable memory 107 may be adapted to store at least one clock forming variable. The clock forming variable may be utilized to control a timing offset between a first boundary scan chain and a second boundary scan chain.

Each of the plurality of ports 105 may be supplied with an IEEE 1149.x clock signal generated by one or more controllers 106. The IEEE 1149.x clock signals may be asynchronous to one another. The relationship between the respective IEEE 1149.x clock signals may be determined by at least on clock forming variable. The IEEE 1149.x clock signal for at least one of the plurality of ports 105 may be controlled independently of the IEEE 1149.x clock signal for at least one of the other plurality of ports 105. One or more of the IEEE 1149.x clock signals may be altered by any combination of phase shifting or frequency shifting. One or more of the IEEE 1149.x clock signals may be altered by adjusting a duty cycle. The duty cycle of any IEEE 1149.x clock signal may be adjustable between 0% and 100%. In one embodiment, the IEEE 1149.x clock signals of two of the plurality of ports 105 may have a fixed duty signal and a clock forming variable may control a phase offset between an IEEE 1149.x clock signal of the first and second ports. In another embodiment, the IEEE 1149.x clock signals of two of the plurality of ports 105 may have a variable duty signal and a clock forming variable may control a phase offset between an IEEE 1149.x clock signal of the first and second ports.

The controller 106 may be adapted to communicate with an external computer 109. The external computer 109 may transmit a test vector to the controller 106. The external computer 109 may transmit at least one clock forming variable to the controller 106. The external computer 109 may receive a test result vector from the controller 106.

The testing system 100 may include a timing circuit 108 in electronic communication with at least one controller 106. The timing circuit 108 may be located external to or onboard a device implementing the controller 106. The timing circuit 108 may provide one or more signal necessary to generate two non-identical IEEE 1149.x clock signals.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus the scope of the invention should be determined by the appended claims and their legal equivalents, and not by the examples given.

That which is claimed is:

1. A testing system comprising:
    a plurality of ports adapted to implement an IEEE 1149.x standard interface;
    at least one controller in electronic communication with at least one of the plurality of ports;
    a programmable memory in electrical communication with the at least one controller and adapted to store at least one clock forming variable;
    wherein the at least one controller is adapted to form an IEEE 1149.x clock signal for at least one of the plurality of ports based on the at least one clock forming variable; and
    wherein the at least one controller controls the IEEE 1149.x clock signal for at least one of the plurality of ports independently of the IEEE 1149.x clock signal for any other of the plurality of ports.

2. The system according to claim 1 wherein the at least one controller is adapted to receive a test vector from, receive at least one clock forming variable from, and transmit a test result vector to an external computer.

3. The system according to claim 1 wherein a duty cycle of the IEEE 1149.x clock signal may be continuously adjustable between 0% and 100%.

4. The system according to claim 1 wherein the at least one clock forming variable controls a duty cycle, frequency, or phase shift of the IEEE 1149.x clock signal of at least one of the plurality of ports.

5. The system according to claim 1 wherein each of the IEEE 1149.x clock signals is adapted to have a fixed duty cycle and at least one clock forming variable controls a phase offset between an IEEE 1149.x clock signal of a first port and an IEEE 1149.x clock signal of a second port.

6. The system according to claim 1 wherein each IEEE 1149.x clock signal is adapted to have a variable duty cycle and at least one clock forming variable controls a phase offset between an IEEE 1149.x dock signal of a first port and an IEEE 1149.x clock signal of a second port.

7. A testing system comprising:
    a plurality of ports adapted to implement an IEEE 1149.x standard interface;
    at least one controller in electronic communication with at least one of the plurality of ports;
    at least one timing circuit in electronic communication with the at least one controller;
    a programmable memory in electrical communication with the at least one timing circuit and adapted to store at least one dock forming variable;
    wherein the at least one controller is adapted to form an IEEE 1149.x clock signal for at least one of the plurality of ports based on the at least one dock forming variable; and
    wherein the at least one controller controls the IEEE 1149.x clock signal for at least one of the plurality of ports independently of the IEEE 1149.x dock signal for any other of the plurality of ports.

8. The system according to claim 7 wherein the at least one controller is adapted to receive a test vector from, receive at least one clock forming variable from, and transmit a test result vector to an external computer.

9. The system according to claim 7 wherein the duty cycle of the IEEE 1149.x clock signal may be continuously adjustable between 0% or 100%.

10. The system according to claim 7 wherein the at least one clock forming variable controls a duty cycle, frequency, or phase shift of the IEEE 1149.x clock signal of at least one of the plurality of ports.

11. The system according to claim 7 wherein each of the IEEE 1149.x clock signal is adapted to have a fixed duty cycle and at least one clock forming variable controls a phase offset between an IEEE 1149.x clock signal of a first port and an IEEE 1149.x clock signal of a second port.

12. The system according to claim 7 wherein each IEEE 1149.x clock signal is adapted to have a variable duty cycle and at least one clock forming variable controls a phase offset between an IEEE 1149.x clock signal of a first port and an IEEE 1149.x clock signal of a second port.

13. A testing system comprising:
    a plurality of ports adapted to implement an IEEE 1149.x standard interface;
    at least one controller in electronic communication with at least one of the plurality of ports;
    at least one timing circuit in electronic communication with the at least one controller;
    a programmable memory in electrical communication with the at least one timing circuit and adapted to store at least one clock forming variable;
    wherein the at least one controller is adapted to form an IEEE 1149.x clock signal for at least one of the plurality of ports based on the at least one clock forming variable;
    wherein the at least one controller controls the IEEE 1149.x clock signal for at least one of the plurality of ports independently of the IEEE 1149.x clock signal for any other of the plurality of ports;
    wherein the at least one controller is adapted to receive a test vector from, receive at least one clock forming variable from, and transmit a test result vector to an external computer; and
    wherein each IEEE 1149.x clock signal is adapted to have a variable duty cycle and at least one clock forming variable controls a phase offset between an IEEE 1149.x clock signal of a first port and an IEEE 1149.x clock signal of a second port.

* * * * *